United States Patent
Min et al.

(10) Patent No.: US 8,296,505 B2
(45) Date of Patent: Oct. 23, 2012

(54) SYSTEM AND METHOD FOR CONTROLLING FLASH MEMORY USING DESCRIPTOR ARRAY

(76) Inventors: Sang Lyul Min, Seoul (KR); Yoonjae Seong, Seoul (KR); Sung-Kwan Kim, Seoul (KR); Joosun Hahn, Seoul (KR)

( * ) Notice: Subject to any disclaimer, the term of this patent is extended or adjusted under 35 U.S.C. 154(b) by 411 days.

(21) Appl. No.: 12/525,553

(22) PCT Filed: Jan. 24, 2008

(86) PCT No.: PCT/KR2008/000431
§ 371 (c)(1),
(2), (4) Date: Oct. 25, 2009

(87) PCT Pub. No.: WO2008/096968
PCT Pub. Date: Aug. 14, 2008

(65) Prior Publication Data
US 2010/0100666 A1      Apr. 22, 2010

(30) Foreign Application Priority Data

Feb. 5, 2007 (KR) .......................... 10-2007-0011751

(51) Int. Cl.
*G06F 12/00* (2006.01)
(52) U.S. Cl. ............... 711/103; 711/115; 365/185.33
(58) Field of Classification Search ............. 711/103, 711/115
See application file for complete search history.

(56) References Cited

U.S. PATENT DOCUMENTS

| | | | |
|---|---|---|---|
| 6,381,682 B2 | 4/2002 | Noel et al. | |
| 6,625,665 B1* | 9/2003 | McCabe | 710/5 |
| 6,704,835 B1* | 3/2004 | Garner | 711/103 |
| 6,725,321 B1* | 4/2004 | Sinclair et al. | 711/103 |
| 7,340,581 B2* | 3/2008 | Gorobets et al. | 711/103 |
| 7,430,632 B2* | 9/2008 | Kim et al. | 711/103 |
| 2002/0188812 A1* | 12/2002 | Sadhasivan et al. | 711/153 |
| 2004/0015561 A1 | 1/2004 | Mayhew et al. | |
| 2007/0156998 A1* | 7/2007 | Gorobets | 711/170 |
| 2007/0186032 A1* | 8/2007 | Sinclair et al. | 711/103 |
| 2008/0028164 A1 | 1/2008 | Ikemoto et al. | |

* cited by examiner

*Primary Examiner* — Hashem Farrokh

(57) ABSTRACT

Disclosed are a system and method for controlling a flash memory using a descriptor array, which may maximize a performance of a flash memory based-storage system. The system includes a descriptor array receipt unit for receiving, from a processor, a descriptor array including, at least one descriptor corresponding to at least one operation; and a flash memory control unit for verifying the descriptor included in the descriptor array and executing a flash memory control command included in the verified descriptor, wherein the flash memory control unit executes the flash memory control command independent from the operation of the processor.

22 Claims, 13 Drawing Sheets

SYSTEM AND METHOD FOR
CONTROLLING FLASH MEMORY USING
DESCRIPTOR ARRAY

TECHNICAL FIELD

The present invention relates to a system and method for controlling a flash memory, and more particularly, to an architecture of a control system being composed of devices for controlling a flash memory in a flash memory based-storage system.

BACKGROUND ART

In general, a flash memory may refer to a nonvolatile memory that retains stored data even without a power supply, and have a function to electrically delete and re-write data in a chip partially or completely. The deletion of data stored in the flash memory may be performed in a block unit as well as in the entire chip, however, cannot be performed in a byte unit.

Many kinds of the flash memories have been developed according to a physical structure of a cell acting as a basic unit in storing data. As representative examples for the flash memory, a Not OR (NOR)-type flash memory used for storing a code and a Not AND (NAND)-type flash memory used for storing data may be given.

As to the NOR-type flash memory, code execution may be possible due to random access of a byte unit similar to the existing static Random Access Memory (SRAM) or Read Only Memory (ROM). However, the NOR-type flash memory may disadvantageously have a relatively low program speed and be disadvantageous for high integration. Conversely, the NAND-type flash memory may have a relatively fast program speed and be advantageous for high integration, however, does not allow random access and has an interface different from the existing SRAM or ROM.

As a result, the NAND-type flash memory capable of realizing the high integration may be widely used in a storage system. The NAND type flash memory may support read and program operations of a page unit (2 KB or 512 KB), and an erase operation of a block unit (128 KB or 16 KB) by itself, which does not provide compatibility with an interface for driving a general memory by a processor. In a conventional art for solving the above-described problems, an interface device for controlling the NAND-type flash memory in a memory interface scheme of the processor has been suggested.

FIG. 1 is a block diagram illustrating a system for controlling a flash memory based on a conventional interface device.

A conventional flash memory control device may merely act as an interface device 130 for providing only the interface compatibility between a processor 110 and a NAND flash memory 140, and thus supporting either only write/read operations of a page unit and erase operation of a block unit, or write/read operations for simultaneously writing/reading a number of pages or a erase operation for simultaneously erasing a number of blocks in a sequential fashion.

However, the conventional flash memory control devices may be required to inform about the corresponding command and address and participate in the data transmission each time the processor 110 requests the interface device 130 to perform an operation. Such a larger overhead in the processor has been known as a main factor for causing a bottleneck phenomenon to occur in the performance of the flash memory based-storage system.

Also, when a number of chips are present in the storage system, the processor 110 is required to participate in performance improvement obtained by utilizing parallelism between chips in the conventional flash memory control device. However, the parallelism of a chip unit cannot be appropriately utilized due to the bottleneck phenomenon on a system bus and a relatively slow program speed.

Also, in a structure of the conventional flash memory control system, a one-unit operation is required to be completed before performing the following unit operation, and therefore an operation already performed is required to be first completed even with respect to another operation with a relatively higher priority determined by a user, which results in an increase in a delay time with respect to a request of the storage system.

Accordingly, a system and method for controlling a flash memory according to the present invention are suggested, which may read/write and erase data by controlling a flash memory even without separate participation of the processor, thereby controlling the flash memory in parallel in a plurality of modules.

DISCLOSURE OF INVENTION

Technical Goals

An aspect of the present invention provides a system and method for controlling a flash memory which may maximize the performance of a flash memory based-storage device.

An aspect of the present invention provides a system and method for controlling a flash memory which may prevent a processor from directly managing the control of the flash memory, thereby minimizing overhead of the processor.

An aspect of the present invention provides a system and method for controlling a flash memory which may allow the flash memory to be managed in parallel in a plurality of modules, thereby effectively managing the flash memory.

An aspect of the present invention provides a system and method for controlling a flash memory which may allow an operation with a priority between a plurality of operations to be first performed, thereby minimizing a delay time with respect to a request of a storage device in the case of an operation requiring a fast response.

Technical Solutions

According to an aspect of the present invention, there is provided a system for controlling a flash memory, the system including: a descriptor array receipt unit for receiving, from a processor, a descriptor array including, at least one descriptor corresponding to at least one operation; and a flash memory control unit for verifying the descriptor included in the descriptor array and executing a flash memory control command included in the verified descriptor, wherein the flash memory control unit executes the flash memory control command independent from the operation of the processor.

According to an aspect of the present invention, there is provided a method for controlling a flash memory, the method including: receiving, from a processor, a descriptor array including at least one descriptor corresponding to at least one operation; and verifying the descriptor included in the descriptor array, and executing a flash memory control command included in the verified descriptor, wherein the executing executes the flash memory control command independent from the operation of the processor.

BEST MODE FOR CARRYING OUT THE INVENTION

Figure 1:
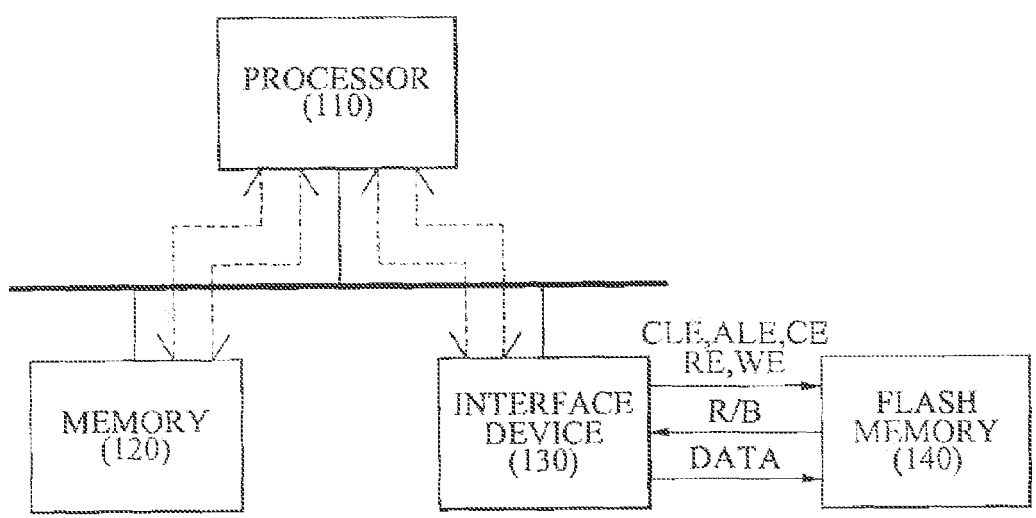
FIG. 1 illustrates a configuration of a system for controlling a flash memory according to a conventional invention.

Reference will now be made in detail to embodiments of the present invention, examples of which are illustrated in the accompanying drawings, wherein like reference numerals refer to the like elements throughout. The embodiments are described below in order to explain the present invention by referring to the figures.

Figure 2:
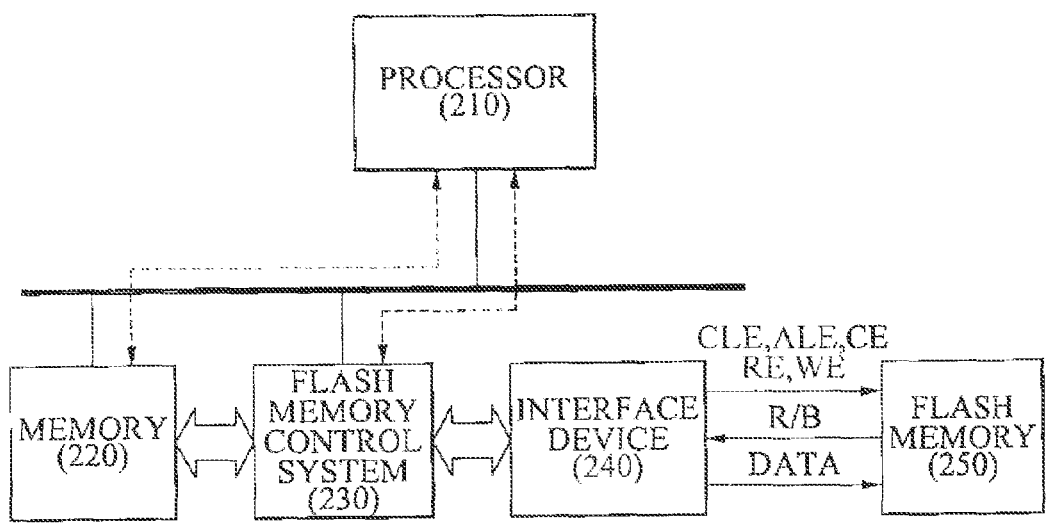
FIG. 2 illustrates a configuration of a flash memory storage system using a system for controlling a flash memory according to an exemplary embodiment of the invention.

FIG. 2 illustrates a configuration of a flash memory storage system using a system for controlling a flash memory according to an exemplary embodiment of the invention.

As illustrated in FIG. 2, a separate flash memory control system 230 having a Direct Memory Access (DMA) control function is positioned between a memory 220 and a flash memory interface device 240, thereby minimizing overhead of a processor 210. The flash memory control system 230 may include a plurality of flash memory control units. However, the flash memory control system 230 including a single flash memory control unit will be herein described in detail.

The processor 210 may store, in the memory 220, read/write/erase operations to be transmitted to a flash memory in accordance with a type of a descriptor defined by a designer, and transmit a corresponding descriptor address to the flash memory control system 230. The flash memory control system 230 receiving, from the processor 210, a start command and information on the processor 210 may read the corresponding descriptor from an address on a known memory, decode commands and data corresponding to the descriptor, and transmit the decoded commands and data to a flash memory interface device 240. The processor 210 may store a plurality of descriptors in the memory 220 in an array fashion, and the flash memory control system 230 may simultaneously process the plurality of descriptors while sequentially reading the array of the descriptors. In a descriptor array based-DMA processing scheme, the processor 210 may simultaneously process a number of requests, thereby minimizing overhead of the processor 210. Also, in the descriptor array based-DMA processing scheme, transmission of commands as well as data may be performed in a DMA scheme unlike a conventional DMA scheme. The following Table 1 shows an example of the descriptor.

TABLE 1

| EOA 30 | Op code 24 | 23 | Memory Region Descriptor address 0 |
|---|---|---|---|
| 31 | Chip # | 16 | 15 # of page 0 |
| Page address | | | Block address |

As shown in Table 1, a single request may designate a descriptor composing three 32-bit words. An 'Op code' shown in Table 1 may be used for identifying erase/program/read commands, and a bit encoding may be arbitrarily determined by a designer. A most significant bit (MSB) of 'Op code' may be used as an End Of Array (EOA) field indicating the end of the descriptor array, A 'chip #' field may identify the number of a chip to which commands are transmitted when a plurality of chips are present, and 'Block address', 'Page address', and '# of page' may identify block and page addresses within the chip, and the number of pages. In this instance, the erase command may be performed in a block unit, and thus fields related with page information such as 'Page address' and the like may be redundant fields. Also, a '# of page' field may be interpreted as a number of blocks which requires to be erased with respect to the erase command. A 'Memory Region Descriptor (MRD) address' field may have a beginning address of a list of other descriptors which designate a memory region (in the case of write) where data to be transmitted to the flash memory is stored, or a memory region (in the case of read) where data read from the flash memory is stored. These descriptors may be referred to as a MRD, and the following Table 2 shows a specific example of the MRD.

TABLE 2

| 31 page data address | 16 | 15 # of page data | 0 |
|---|---|---|---|
| Next MRD address | | | |

Data of all pages to be transmitted to the flash memory may be scattered in a nonconsecutive space within the memory, and thus MRDs indicating memory regions where these data are positioned may be bundled in a series of list type. A single MRD may designate a single memory space that is consecutive for at least a number of pages indicated by a '# of page data' field starting from a beginning address indicated by a page data address of Table. 2. A material structure obtained by connecting the MRDs in a list type by a 'Next MRD address' field may describe a memory region where data of the overall pages to be transmitted to the flash memory is present. (Conversely, in the case of read, the material structure may describe a memory region for storing data to be read from the flash memory)

Figure 8:
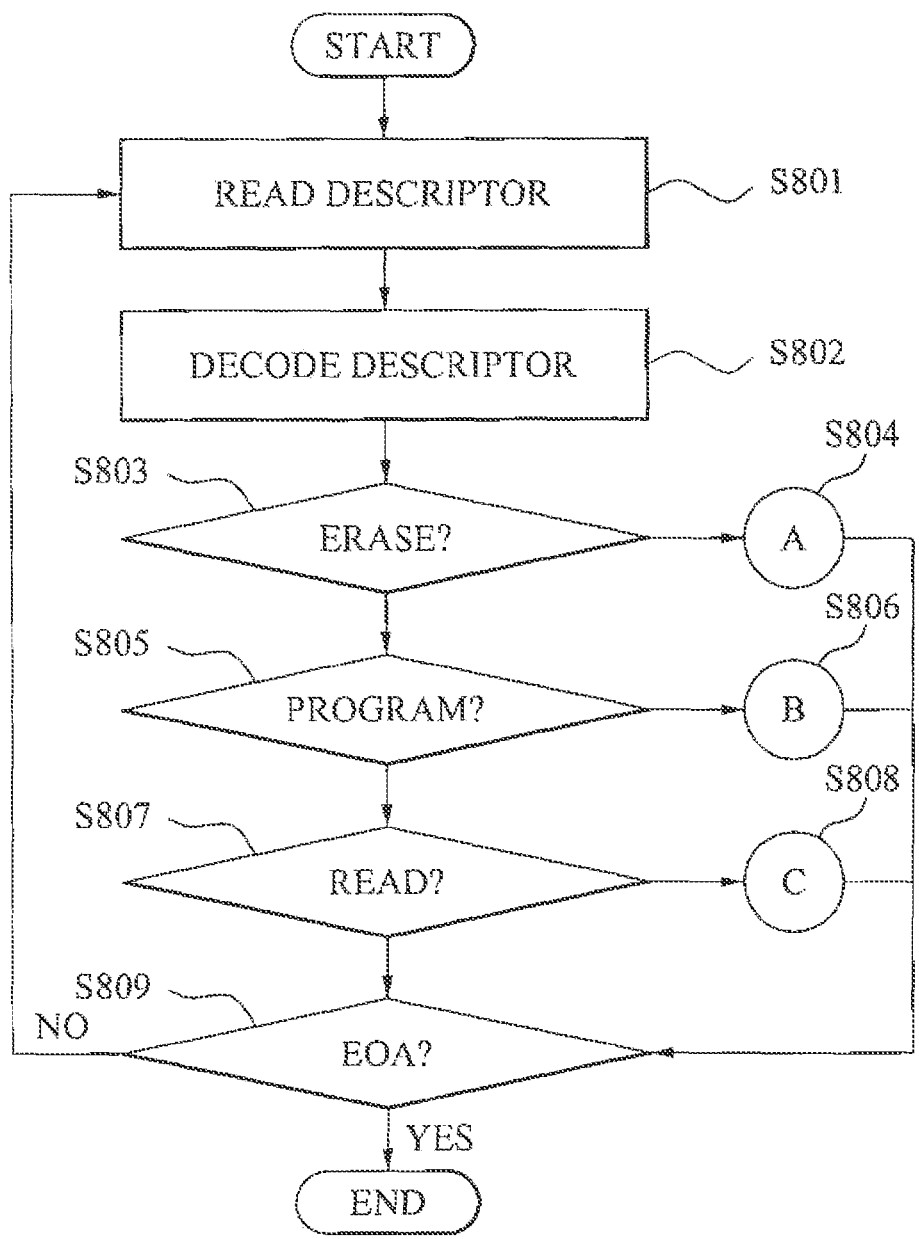
FIG. 8 is a flowchart illustrating a process for processing a descriptor by a method for controlling a flash memory according to an exemplary embodiment of the invention.

FIG. 8 is a flowchart illustrating a process for processing a descriptor by as method for controlling a flash memory according to an exemplary embodiment of the invention.

In operation S801, the flash memory control system receiving a start command from the processor may read three 4-byte words (32-bits) from a memory address transmitted via a command register. The three 4-byte words may be a descriptor designating a unit request to be processed by the flash memory control device as described above. The flash memory control system reading the descriptor from the memory may perform a decoding operation in accordance with a type of Table 1. Specifically, the flash memory control system may identify that an 'Op code' field corresponds to which one of erase/program/read commands in operation S802, and then diverge into a flow corresponding to the respective commands in operations S803 to S807. After passing through all flows corresponding to the respective commands, in operation S809, the flash memory control system may determine whether the corresponding descriptor is a final descriptor of the array based on the EOA field of the MSB 'Op code'. In this instance, when the BOA field is checked, the flash memory control device may finish all operations and return to be in a ready state, otherwise, the flash memory control device may read a new descriptor from the following address (+12 bits in the present exemplary embodiment) of an address having read the preceding descriptor, and perform an operation for a new request.

Figure 3:
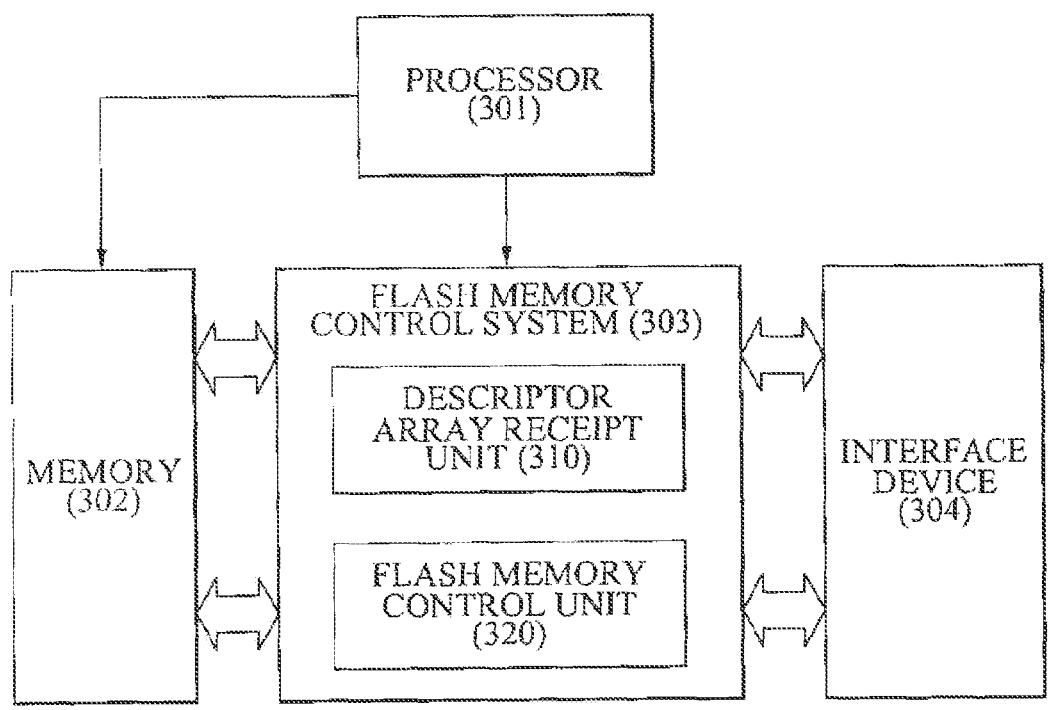
FIG. 3 illustrates an internal configuration of a system for controlling a flash memory according to an exemplary embodiment of the invention.

FIG. 3 illustrates an internal configuration of a system 303 for controlling a flash memory according to an exemplary embodiment of the invention.

As illustrated in FIG. 3, the system 303 according to the present exemplary embodiment may include a descriptor array receipt unit 310, and a flash memory control unit 320. Here, the above described components may be software based, hardware based, or a combination thereof.

The descriptor array receipt unit 310 may receive, from a processor 301, a descriptor array including at least one descriptor corresponding to at least one operation. The descriptor may include a variety of information used for controlling the flash memory as shown in Table 1. The descriptor array receipt unit 310 may directly receive the descriptor array from the processor 301 via a bus or a network, or read and receive the descriptor array stored in a memory 302 by the processor 301 as described above.

The flash memory control unit 320 may confirm a descriptor included in the descriptor array, and perform a flash memory control command included in the confirmed descriptor. The flash memory control unit 320 may be operated independent from the operation of the processor 301, and thus the processor 301 may obtain an effect of controlling the flash memory without separate tasks such as generating a descriptor array, transmitting the generated descriptor array to the descriptor array receipt unit 310, and separately managing the transmitted descriptor. As a result, the overhead of the processor 301 may be significantly reduced.

Also, the flash memory control unit 320 may be composed of a single module as described above, and thus sequentially decoding and processing the descriptor of the descriptor array. Also, the flash memory control unit 320 may be composed of a plurality of modules, and thus allowing the plurality of modules to control the flash memory in parallel. When the flash memory control unit 320 is configured such that the plurality of modules are operated in parallel, operations capable of being processed in parallel may be rapidly processed, thereby improving the processing speed.

Also, the flash memory control unit 320 may include a background flash memory control unit and a foreground flash memory control unit in the plurality of modules. In this case, the descriptors may be divided into a descriptor including the background flash memory control command and a descriptor including the foreground flash control command, respectively. In this instance, the foreground flash memory control unit may process a flash memory control command requiring a rapid processing, and the background flash memory control unit may process a flash memory control command in which a delay processing may be executed. Here, the background flash memory control unit and the foreground flash memory control unit may include a plurality of sub flash memory control units formed therein, and also include a sequencer for controlling the plurality of sub flash memory control units, which will be described in detail as below.

When the flash memory control unit 320 is composed of a plurality of modules, each of the plurality of sub flash memory control units may act as either an independent hardware device, or software-based or hardware-based modules within a single device. However, the flash memory control unit 320 may have no limitation in its type as long as operations are being performed in parallel, and thus, the present exemplary embodiments are not limited by a specific type.

Figure 4:
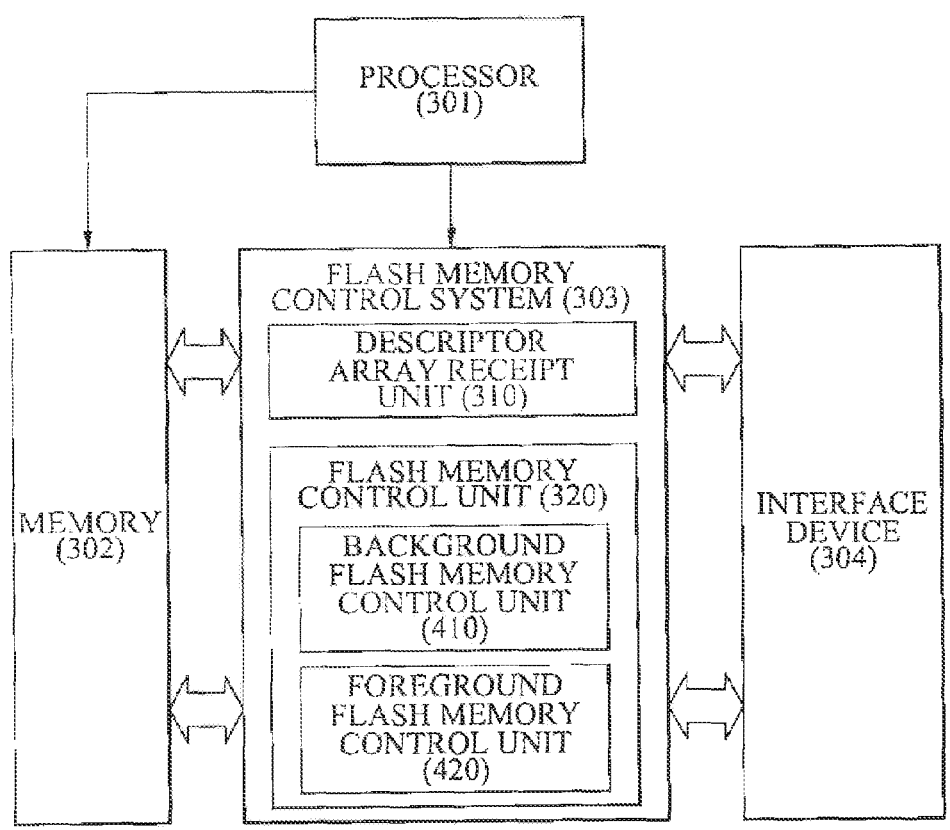
FIG. 4 illustrates an internal configuration of a system for controlling a flash memory according to another exemplary embodiment of the invention.

FIG. 4 illustrates an internal configuration of a system 303 for controlling a flash memory according to another exemplary embodiment of the invention.

The system 303 for controlling the flash memory may include a foreground flash memory control unit 420 for processing a foreground flash memory command requiring a relatively rapid response speed such as read commands received from the processor 301, and a background flash memory control unit 410 for processing a background flash memory command capable of being relatively tolerant temporally such as commands for actually storing data temporarily buffered in the memory 302 on a flash memory. The respective sub systems may be composed of the above-described descriptor array based-flash memory control device. In order to receive requests from the background flash memory control unit and the foreground flash memory control unit, respectively, an interface device 304 may have two input ports. For the purpose of minimizing a delay time of the storage system, priority of requests from the foreground flash memory control unit 420 are performed as early as possible with respect to requests from the background flash memory control unit 410.

For this purpose, the flash memory control unit may divide a request (request designated as a single descriptor) of a relatively large unit, which ranges over a plurality of blocks or pages received from the processor, into a plurality of erase requests, each of which is of a block unit, and a plurality of read/program requests, each of which is of a page unit, and then transmit the divided requests to the interface device 304. In this instance, a Synchronization (SYNC) packet acting as a marker indicating a boundary between the respective unit requests may be inserted therebetween.

Figure 7:
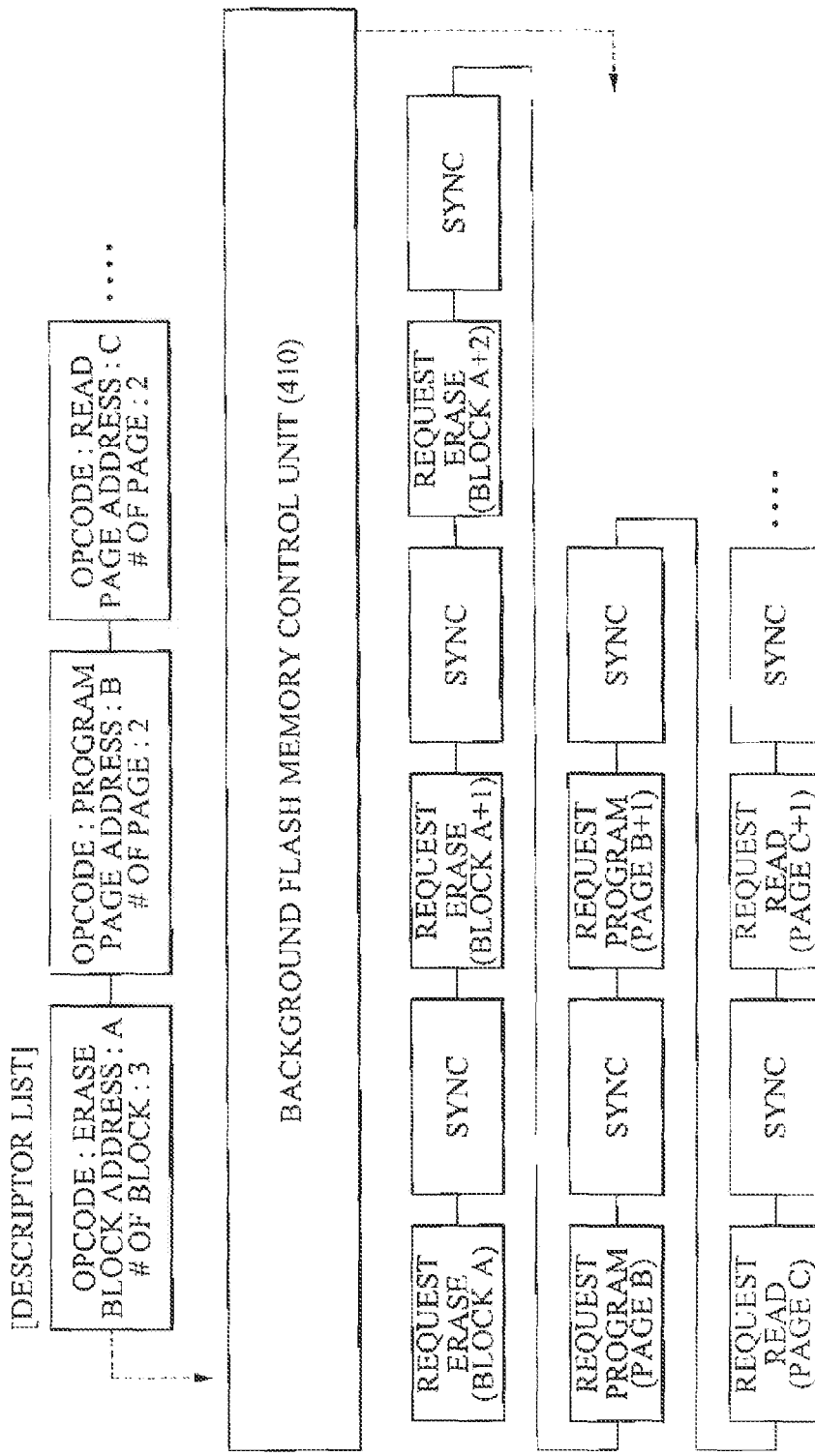
FIG. 7 illustrates an example for processing a descriptor in a background flash memory control unit of a system for controlling a flash memory according to an exemplary embodiment of the invention.

FIG. 7 illustrates an example for processing a descriptor in a background flash memory control unit of a system for controlling a flash memory according to an exemplary embodiment of the invention.

In the storage system being composed of a plurality of flash memory buses, the SYNC packet may be requested for gang synchronization between the interface devices one being present in each bus. Specifically, a point of time when the SYNC packet arrives at all interface devices may be a scheduling point of time when the requests of the foreground flash memory control unit are capable of preempting the requests of the background flash memory control unit. As to the system having only a single flash memory bus, a point of time when the SYNC packet arrives at the interface device may be merely recognized as the preemptible scheduling point of time.

The interface device 304 of the system according to the present exemplary embodiment may generate physical control signals corresponding to flash commands such as inputted erase/program/read and the like, and also implement services based on a priority by means of two input ports capable of receiving requests different from each other and a scheduling operation performed by the SYNC packet.

Figure 12:
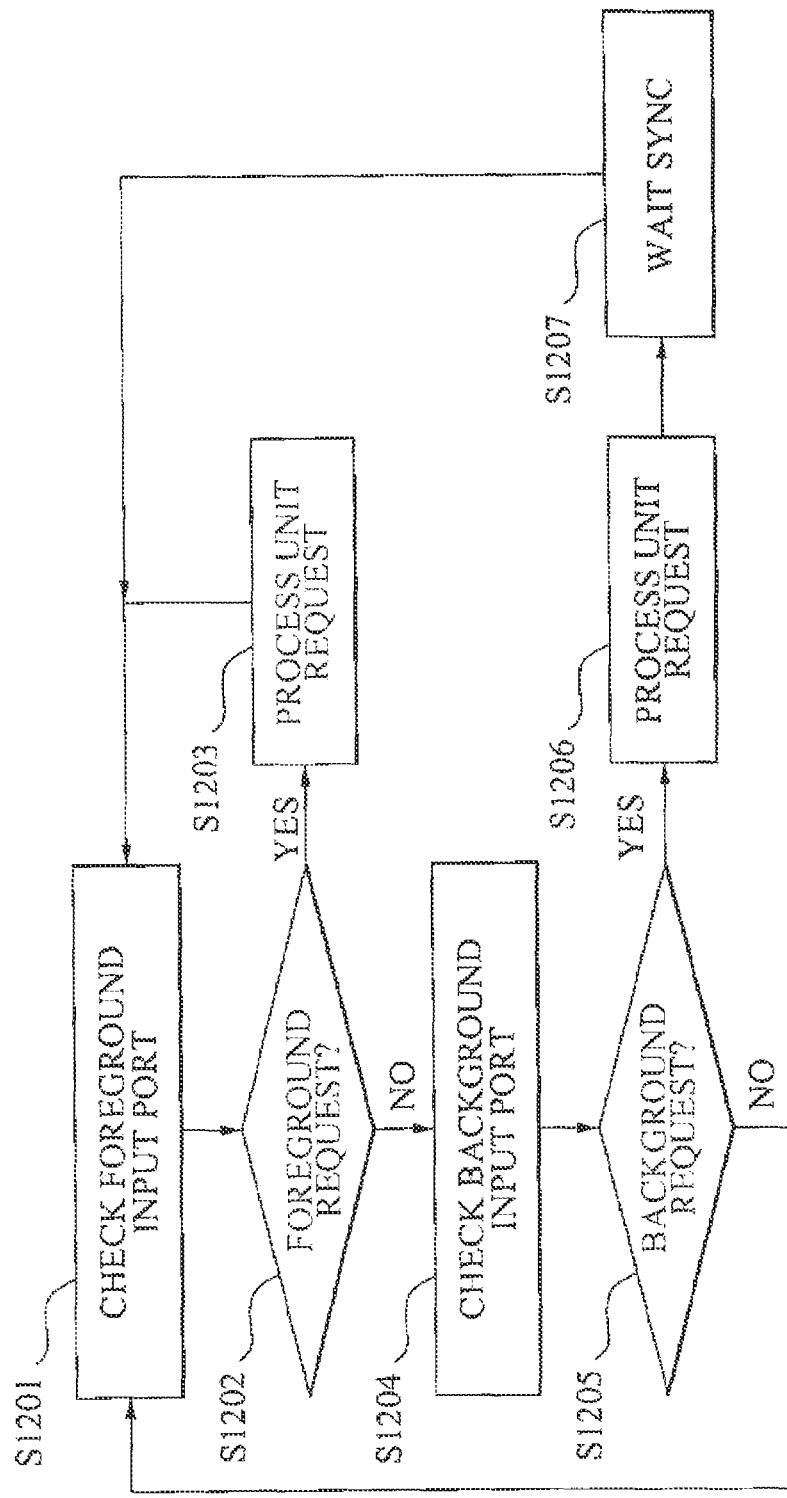
FIG. 12 illustrates a flowchart in which a foreground flash memory control command and a background flash memory control command are processed, respectively, by a method for controlling a flash memory according to an exemplary embodiment of the invention.

FIG. 12 illustrates a flowchart in which a foreground flash memory control command and a background flash memory control command are processed, respectively, by a method for controlling a flash memory according to an exemplary embodiment of the invention. The process of FIG. 12 may denote operations performed in the interface device 304 connected with the flash memory control system according to the present exemplary embodiment.

As described above, a request of the foreground flash memory control unit (hereinafter referred to 'foreground request'), always has a higher priority than that of a request of the background flash memory control unit (hereinafter referred to 'background request'). Accordingly, in operation S1201, the interface device 304 first checks an input port (hereinafter, referred to 'foreground input port') via which only the foreground request is received. In operation S1204, the interface device 304 checks an input port (hereinafter referred to 'background input port') via which only the background request is received. When a request received from the foreground input port is present in operation S1202, the interface device 304 processes the corresponding unit request in operation S1203, and then checks the foreground input port again. Next, while a foreground request is present, the interface device 304 repeatedly processes the corresponding service, otherwise, advances to the following operation for checking the background input port in operation S1204. When the background request has not arrived in operation S1204, the interface device 304 may return to an operation for checking the foreground input port, and repeat operations for alternatively checking the foreground input port and the background input port until the background request is present. When the background request arrives, the interface device 304 processes the corresponding unit request of the background in operation S1206, and then waits for a SYNC point in operation S1207. Here, as described above, the SYNC point may denote the point of time when the SYNC packet arrives at all interface devices in the case of the storage system being composed of the plurality of flash memory buses, and also denote a point of time when the SYNC packet arrives at the corresponding interface device in the ease of the system having only the single flash memory bus.

The interface device 304 reaching the SYNC point may return to the operation for checking the foreground input port, thereby resulting in giving the foreground request higher priority. When the foreground request is present in the SYNC point, the foreground request preempts the background request, otherwise, the background request is repeatedly processed.

Operations for processing the unit request of FIG. 12 may designate a process for generating physical control signals transmitted to the flash memory chip with respect to the erase request of the block unit, and the program/read request of the page unit. The process may be performed in a typical method which is well known to those skilled in the art.

Figure 5:
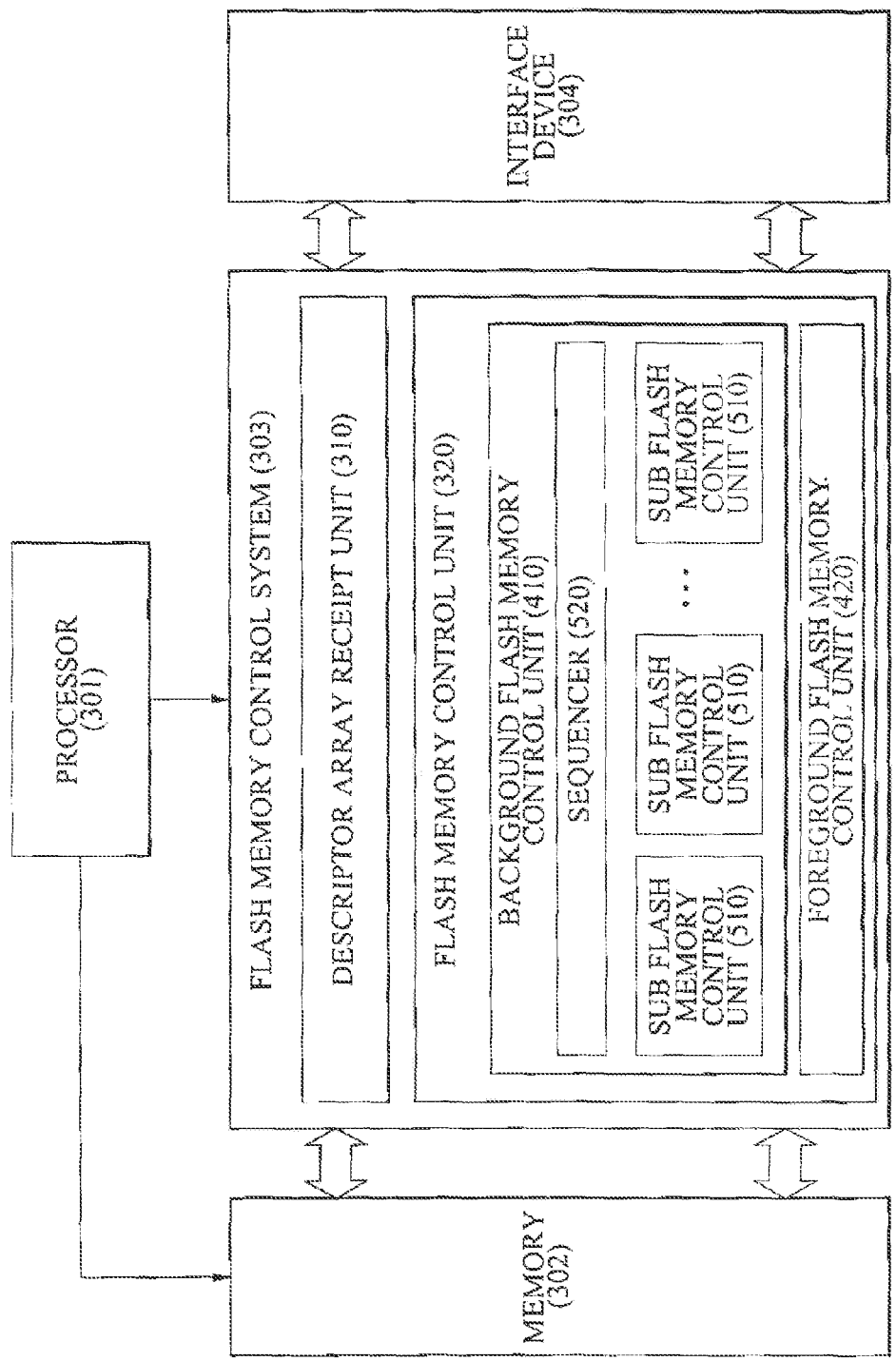
FIG. 5 illustrates an internal configuration of a system for controlling a flash memory according to still another exemplary embodiment of the invention.

FIG. 5 illustrates an internal configuration of a system for controlling a flash memory according to still another exemplary embodiment of the invention. As can be seen in FIG. 5, internal configurations of the foreground flash memory control unit and the background flash memory control unit are illustrated in detail, respectively.

The above-described operations with respect to the background may have a room for maximally utilizing parallelism of a number of chips in view of characteristics of the operation for reflecting data temporarily buffered in the memory on the flash memory. In consideration of this, the flash memory control system according to the present exemplary embodiment may maximize the parallelism of the chip unit in such a way that the background flash memory control unit 410 is composed of a plurality of sub flash memory control units each being separately operated, and each of the plurality of sub flash memory control units manages the operations with respect to the background, which is applied to different chips. A number of sub flash memory control units being composed of the background flash memory control unit 410 may be increased according to a designer's decision with respect to the parallelism of the chip unit capable of being maximally utilized. The plurality of sub flash memory control units may share an input port assigned to the background operations from among two input ports of the interface device 304, and thus only a single sub flash memory control unit may be activated at any one moment in the process. A sequencer 520 illustrated in FIG. 5 may serve as a scheduler for determining the execution order of the plurality of sub flash memory control units 510.

Figure 9:
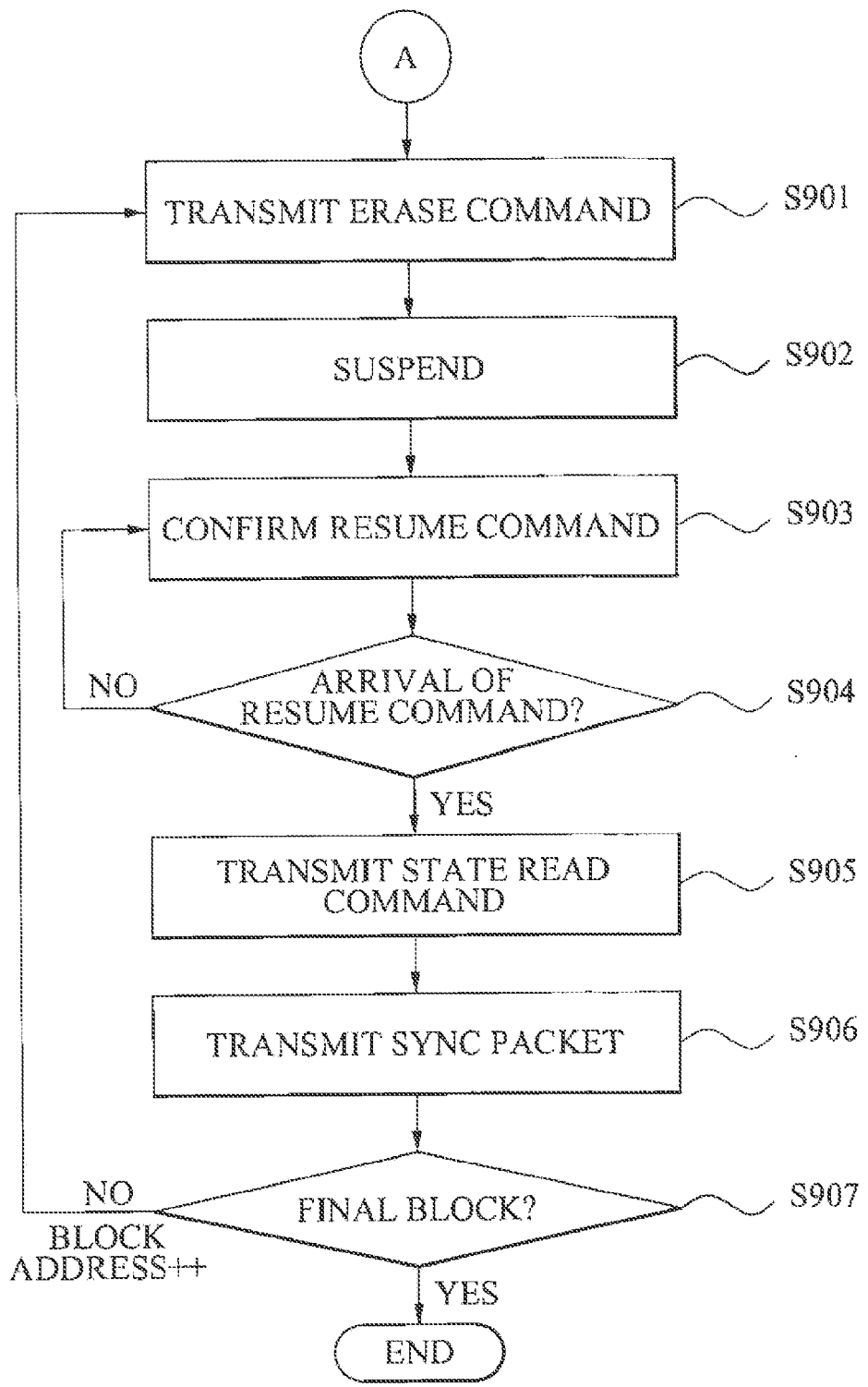
FIG. 9 is a flowchart illustrating a process for processing an erase command by a method for controlling a flash memory according to an exemplary embodiment of the invention.
Figure 10:
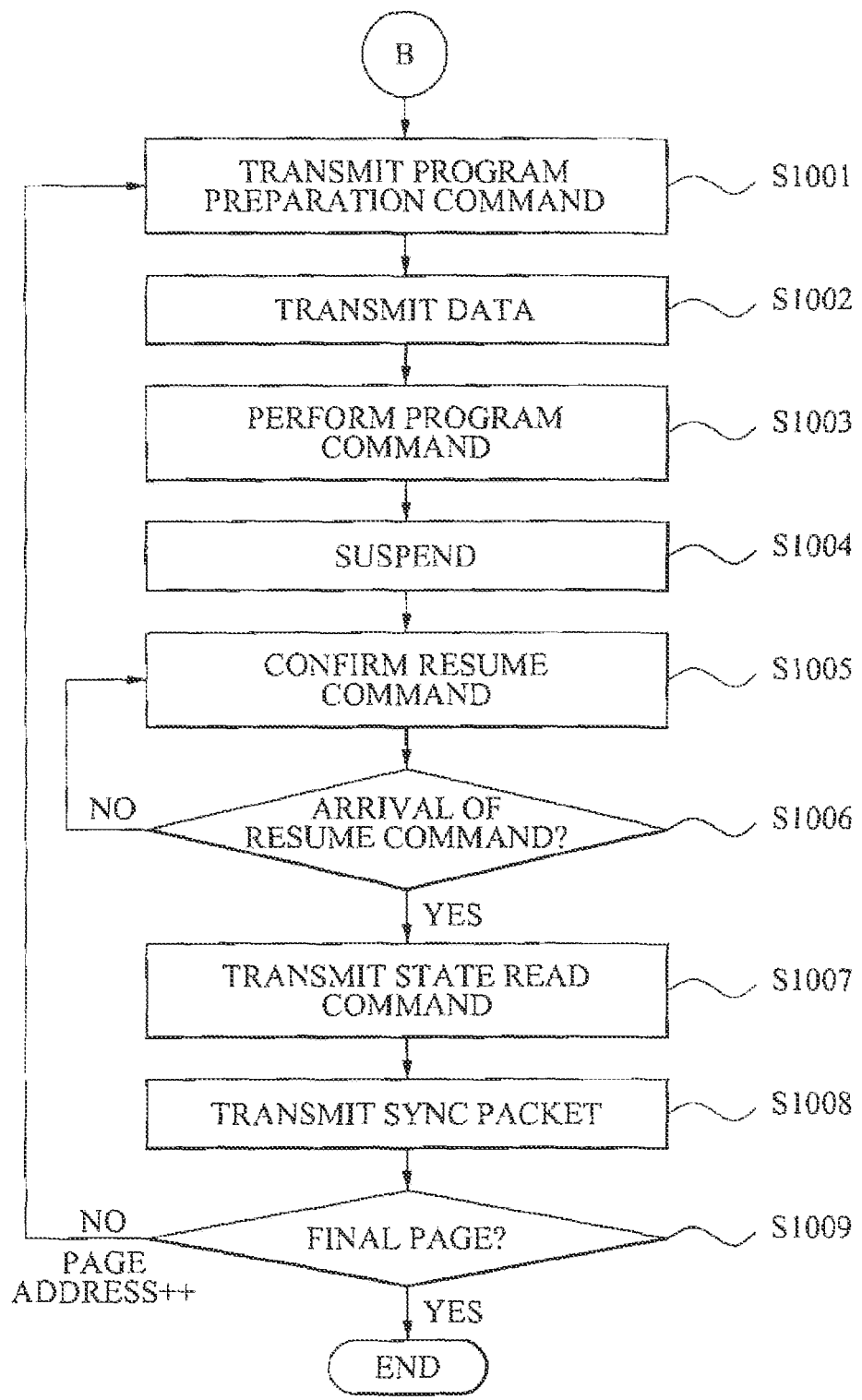
FIG. 10 is a flowchart illustrating a process for processing a program command by a method for controlling a flash memory according to an exemplary embodiment of the invention.
Figure 11:
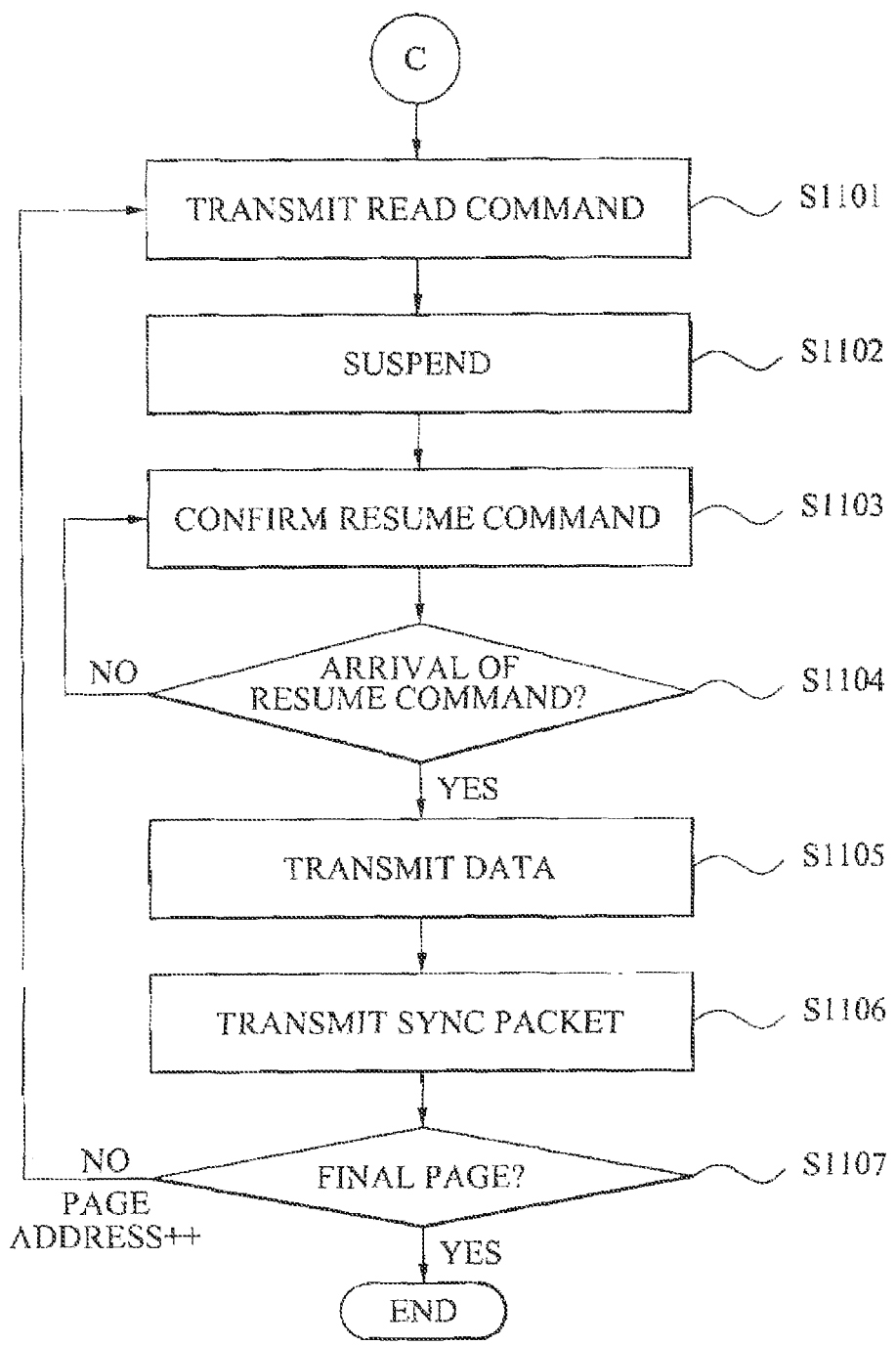
FIG. 11 is a flowchart illustrating a process for processing a read command by a method for controlling a flash memory according to an exemplary embodiment of the invention.

An internal operation of each of the plurality of sub flash memory control units 510 will be described in detail in order to understand a process where different flash memory control devices are sequenced without collision. FIGS. 9 to 11 are flowcharts illustrating a process where each of the plurality of sub flash memory control units 510 is internally operated for each type of erase/program/read commands, respectively, after the process for processing the descriptor array based request as described in FIG. 8.

FIG. 9 is a flowchart illustrating a process for processing an erase command by a method for controlling a flash memory according to an exemplary embodiment of the invention.

A sub flash memory control unit diverged into 'A' illustrated in FIG. 8 may transmit an erase command transmitted to the corresponding block address to the interface device based on 'Block Address' field of the descriptor shown in Table 1. The sub flash memory control unit may be autonomously suspended after transmitting the erase command, and wait for a resume command from the sequencer. When the resume command is received, the sub flash memory control unit may transmit a flash state read command after leaving the suspended state in order to check whether the erase command previously transmitted to the interface device is successfully performed. Subsequently, the sub flash memory control unit may transmit the SYNC packet used for reporting about a point of time for the preoccupancy to the interface device, and then check whether the block being currently processed is a final block of the request indicated by the corresponding descriptor based on '# of PAGE' field of the descriptor illustrated in Table 1. When the block is the final block, the sub flash memory control unit may complete a processing with respect to the corresponding descriptor, and advance to operation S809 illustrated in FIG. 8, otherwise, the sub flash memory control unit may increase the block address by 1, and then return to the initial operation to thereby repeatedly perform a process with respect to the following block.

FIG. 10 is a flowchart illustrating a process for processing a program command by a method for controlling a flash memory according to an exemplary embodiment of the invention.

A sub flash memory control unit diverged into 'B' illustrated in FIG. 8 may transmit a command used for preparing a program, which is transmitted to the corresponding page of the corresponding block, to the interface device based on 'Block Address' field and 'Page Address' field of the descriptor shown in Table 1. Subsequently, the sub flash memory control unit may read, from the memory, data to be programmed based on an MRD list connected with the descriptor, transmit the read data to the interface device, and then order a program command. The subsequent processes may include operations such as suspend and resume, the state read command transmission for checking whether the program is successfully completed, checking whether to be a final page of the request, which are similar with the processes performed with respect to the erase command.

FIG. 11 is a flowchart illustrating a process for processing a read command by a method for controlling a flash memory according to an exemplary embodiment of the invention.

A sub flash memory control unit diverged into 'C' illustrated in FIG. 8 may transmit, to the interface device, a command used for reading data from the corresponding page of the corresponding block based on 'Block Address' field and 'Page Address' field. The subsequent processes of suspend and resume are the same as those of erase/program commands. Next, an operation for recording read data on the memory based on the MRD list may correspond to the data transmission operation of the program command. Finally, the sub flash memory control unit may transmit the SYNC packet. Here, the operation for checking whether to be a final page of the request is the same, as that of the program command.

In order to understand the process where the plurality of sub flash memory control units are sequenced with reference to FIGS. 9 to 11, it is noted in that the sub flash memory control unit autonomously gives up a command transmission authority to thereby be suspended. As illustrated in FIGS. 9 to 11, a point of time when the sub flash memory control units are commonly suspended is immediately after commands having a relatively longer processing time period such as when the erase/program/read commands are transmitted to the interface device. When the sub flash control unit is autonomously suspended, the sub flash memory control unit may give the command transmission authority to another sub flash control unit waiting for commands transmitted to the chip having different sequencers, thereby utilizing the parallelism of the chip unit. In this instance, a sub flash memory control unit being an object of the following scheduling may be a sub flash memory control unit in which a chip performing a command while being currently suspended is in a ready state. When a sub flash memory control unit intended to be subsequently performed is determined, the sequencer may transmit a resume command, and thereby the suspended state of the corresponding sub flash memory control unit is released. For the purpose of determining the above scheduling, the sequencer is required to identify a flash chip that is used for performing commands by each of the plurality of sub flash memory control units, and also required to keep checking a ready/busy state (R/B) of the flash chips.

Figure 6:
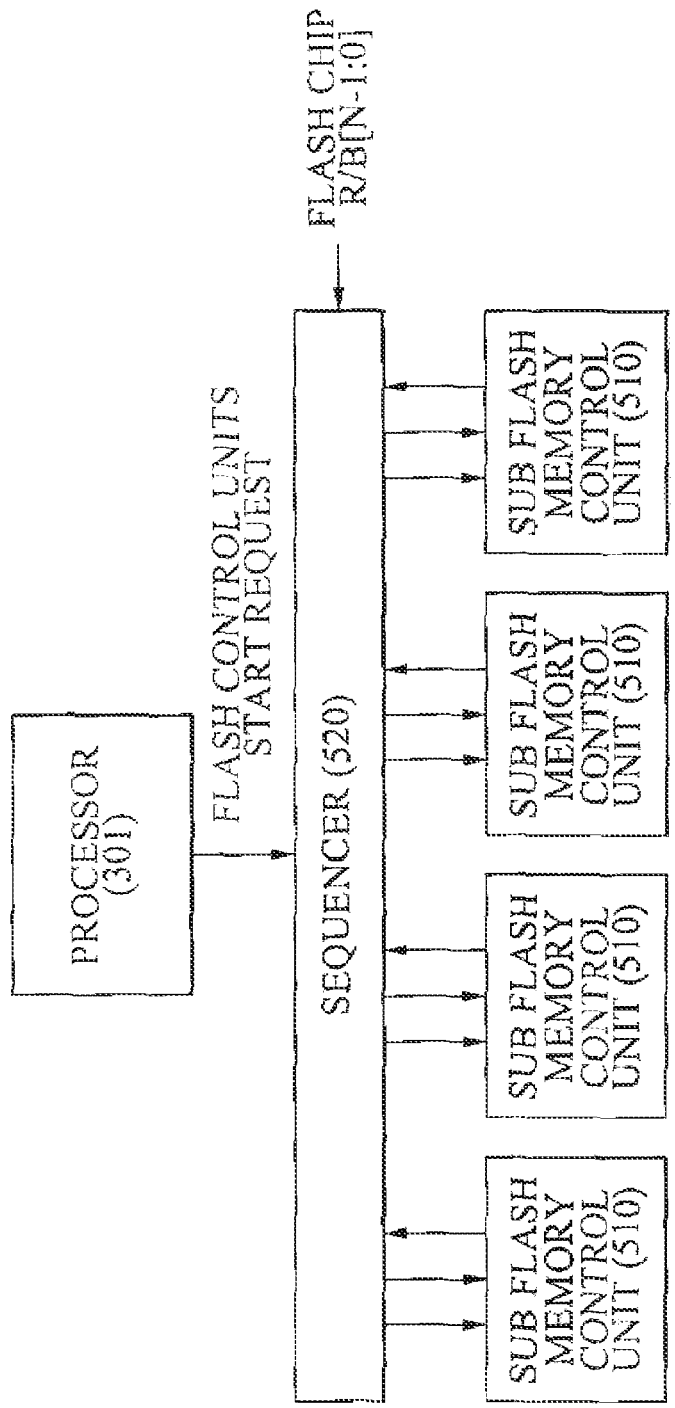
FIG. 6 illustrates a configuration in which a sequencer manages a plurality of sub flash memory control units in a system for controlling a flash memory according to an exemplary embodiment of the invention.

FIG. 6 illustrates a configuration in which a sequencer 520 manages a plurality of sub flash memory control units 510 in a system for controlling a flash memory according to an exemplary embodiment of the invention.

First, the processor may inform the sequencer 520 of the number of a sub flash memory control unit 510 intended to be newly operated via a series of signal lines, and a beginning address of the descriptor assigned to each of the plurality of sub flash memory control unit 510. Subsequently, the corresponding sequencer 520 may simultaneously drive the corresponding sub flash memory control units 510. Also, the address of the descriptor assigned to each of the plurality of sub flash memory control units 510 may be transmitted to the corresponding sequencer 520, and at the same time, the driven sub flash memory control units 510 is autonomously suspended immediately after being driven in order to prevent the sub flash memory control units 510 from colliding with one another with respect to an assigned single input port in the background flash memory control unit. The sequencer 520 may determine an execution order of the suspended sub flash memory control units 510 using the scheduling. Each of the plurality of sub flash memory control units 510 may inform the sequencer 520 of information on its suspension and the flash chip used for performing the command. The sequencer 520 may receive the ready/busy state from plural (N) flash memory chips, determine a sub flash memory control unit 510 to be subsequently performed, and transmit a resume command.

Figure 13:
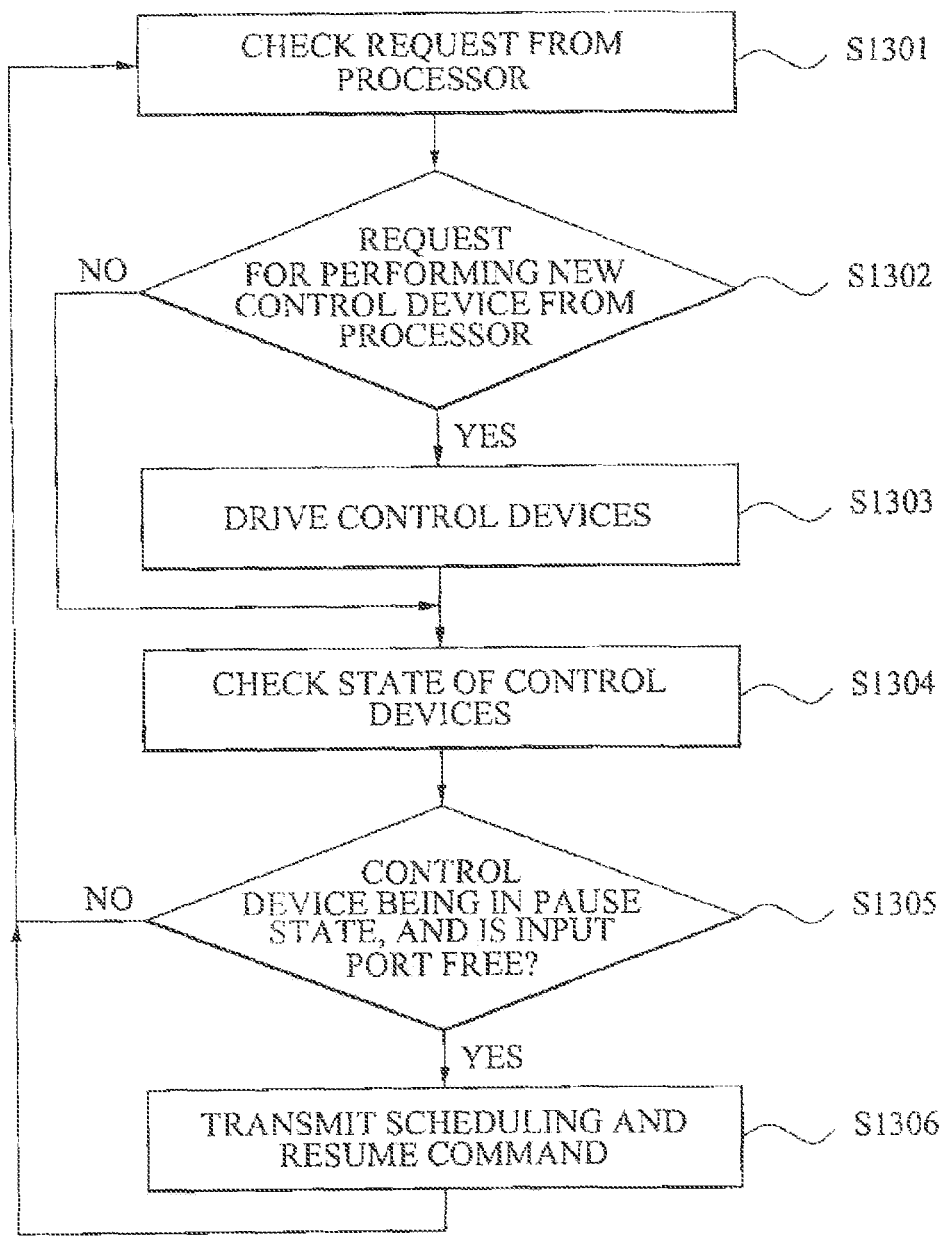
FIG. 13 is a flowchart illustrating operations of a sequencer for managing a sub flash memory control unit in a system for controlling a flash memory according to an exemplary embodiment of the invention.

FIG. 13 is a flowchart illustrating operations of a sequencer for managing a sub flash memory control unit in a system for controlling a flash memory according to an exemplary embodiment of the invention.

The operations of FIG. 13 may be divided into operations S1301 to S1303 for driving new flash memory control devices, and operations S1304 to S1304 for performing a scheduling with respect to the flash memory control devices having been driven. The sequencer may drive sub flash memory control units to be newly operated, each being an object to perform the scheduling, while repeatedly performing the divided operations. When the scheduling is required to be performed with respect to the sub flash memory control units, the sequencer may adjust the execution order between the flash memory control devices being in the suspended state, and transmit the resume command to the flash memory control devices. The case where the sequencer is required to perform the scheduling may correspond to the case where the sub flash memory control units being in the suspended state are present while the input port of the interface device is not used such as operations S1304 and S1305. In this instance, a scheduling order in which the sequencer grants the command transmission authority to the flash memory control device may be obtained using an arbitrary algorithm of a designer, or using a round-robin scheme which offers an equal opportunity to all flash memory control devices, respectively, in order to prevent a specific flash memory control device from being in a suspended state for a relatively longer period in operation S1306.

The method for controlling a flash memory according to the above-described exemplary embodiments of the present invention may be recorded in computer-readable media including program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts. Examples of computer readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described exemplary embodiments of the present invention.

As described above, according to the present invention, a performance of the flash memory based-storage device may be maximized.

According to the present invention, the processor is prevented from directly managing the control of the flash memory, thereby minimizing overhead of the processor.

According to the present invention, the flash memory may be allowed to be managed in the plurality of modules in parallel, thereby effectively managing the flash memory.

According to the present invention, the preoccupancy may be realized according to a priority between the plurality of operations, thereby minimizing the delay time with respect to the request of the storage device in the case of the operation requiring a fast response time.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A system for controlling a flash memory, the system comprising:
    a descriptor array receipt unit for receiving, from a processor, a descriptor array including at least one descriptor corresponding to at least one operation; and
    a flash memory control unit for verifying the descriptor included in the descriptor array and executing a flash memory control command included in the verified descriptor,
    wherein the descriptor is stored in a memory different from the flash memory, in an array fashion,
    wherein the flash memory control unit returns to be in a ready state by finishing all operation by the descriptor,
    wherein the flash memory control unit executes the flash memory control command independent from the operation of the processor;
    wherein the flash memory control command includes a foreground flash memory control command and a background flash memory control command,
    wherein the flash memory control unit divides the descriptor into a plurality of unit requests with respect to block or page, and inserts a Synchronization (SYNC) packet acting as a marker indicating a boundary between the unit requests,
    wherein a point of time when the SYNC packet arrives at all interface devices is a scheduling point of time when the requests of the foreground flash memory control command are capable of preempting the requests of the background flash memory control command.

2. The system of claim 1, wherein the flash memory control command includes an erase command, a program command, or a read command.

3. The system of claim 1, wherein the descriptor includes a page address of a flash memory being an object of the flash memory control command included in the descriptor.

4. The system of claim 1, wherein the descriptor includes a block address of a flash memory being an object of the flash memory control command included in the descriptor.

5. The system of claim 1, wherein the descriptor includes memory information where data for recording on a flash memory is stored.

6. The system of claim 1, wherein the descriptor includes memory information where data for reading from a flash memory is stored.

7. The system of claims 5, wherein the memory information includes a data structure in which a plurality of memory addresses are connected in a linked list fashion.

8. The system of claim 1, wherein the foreground flash memory control command is a flash memory control command requiring a fast response time.

9. The system of claim 1, wherein the flash memory control unit preferentially processes a descriptor including the foreground flash memory control command from among descriptors included in the descriptor array.

10. The system of claim 1, wherein the flash memory control unit includes:
    a foreground flash memory control unit for processing a foreground flash memory control command; and
    a background flash memory control unit for processing a background flash memory control command.

11. The system of claim 10, wherein the background flash memory control unit includes at least one sub-flash memory control unit, and the at least one sub-flash memory control unit is independently operated.

12. The system of claim 11, wherein the background flash memory control unit includes a sequencer for controlling an operation of the at least one sub-flash memory control unit.

13. A system for controlling a flash memory, the system comprising:
    a flash memory control command receipt unit for receiving, from a processor, a flash memory control command including a foreground flash memory control command and a background flash memory control command;
    a foreground flash memory control unit for executing the foreground flash memory control command; and
    a background flash memory control unit for executing the background flash memory control command,
    wherein the descriptor is stored in a memory different from the flash memory, in an array fashion,
    wherein the flash memory control command is included in a descriptor,
    wherein the flash memory control unit returns to be in a ready state by finishing all operation by the descriptor,
    wherein the foreground flash memory control unit and the background flash memory control unit execute the flash memory control command in parallel
    wherein the flash memory control unit divides the descriptor into a plurality of unit requests with respect to block or page, and inserts a Synchronization (SYNC) packet acting as a marker indicating a boundary between the unit requests,
    wherein a point of time when the SYNC packet arrives at all interface devices is a scheduling point of time when the requests of the foreground flash memory control command are capable of preempting the requests of the background flash memory control command.

14. The system of claim 13, wherein the foreground flash memory control command is a flash memory control command requiring a fast response time.

15. The system of claim 13, wherein the background flash memory control unit includes at least one sub-flash memory control unit, and the at least one sub-flash memory control unit is independently operated.

16. The system of claim 15, wherein the background flash memory control unit includes a sequencer for controlling an operation of the at least one sub-flash memory control unit.

17. A method for controlling a flash memory, the method comprising:
receiving, from a processor, a descriptor array including at least one descriptor corresponding to at least one operation; and
verifying the descriptor included in the descriptor array;
dividing the descriptor into a plurality of unit requests with respect to block or page;
executing a flash memory control command included in the verified descriptor,
wherein the descriptor is stored in a memory different from the flash memory, in an array fashion,
wherein the flash memory control unit returns to be in a ready state by finishing all operation by the descriptor,
wherein the executing executes the flash memory control command independent from the operation of the processor
wherein the flash memory control command includes a foreground flash memory control command and a background flash memory control command,
wherein the flash memory control unit divides the descriptor into a plurality of unit requests with respect to block or page, and inserts a Synchronization (SYNC) packet acting as a marker indicating a boundary between the unit requests,
wherein a point of time when the SYNC packet arrives at all interface devices is a scheduling point of time when the requests of the foreground flash memory control command are capable of preempting the requests of the background flash memory control command.

18. The method of claim 17, wherein the flash memory control command includes an erase command, a program command, or a read command.

19. The method of claim 17, wherein the flash memory control command includes a foreground flash memory control command and a background flash memory control command.

20. The method of claim 19, wherein the foreground flash memory control command is a flash memory control command requiring a fast response time.

21. The method of claim 19, wherein the executing preferentially processes a descriptor including the foreground flash memory control command from among descriptors included in the descriptor array.

22. A non-transitory computer-readable recording medium storing a program for implementing the method of claim 17.

* * * * *